(12) United States Patent
Wang

(10) Patent No.: US 12,314,637 B2
(45) Date of Patent: May 27, 2025

(54) METHOD FOR GENERATING PLANAR EXPANDABLE STRUCTURE BY ADDING HINGED POINTS AND HINGED RODS

(71) Applicant: ZHEJIANG UNIVERSITY, Hangzhou (CN)

(72) Inventor: Hui Wang, Hangzhou (CN)

(73) Assignee: ZHEJIANG UNIVERSITY, Hangzhou (CN)

( * ) Notice: Subject to any disclaimer, the term of this patent is extended or adjusted under 35 U.S.C. 154(b) by 0 days.

(21) Appl. No.: 18/737,854

(22) Filed: Jun. 7, 2024

(65) Prior Publication Data

US 2024/0330525 A1  Oct. 3, 2024

Related U.S. Application Data

(63) Continuation of application No. PCT/CN2022/123865, filed on Oct. 8, 2022.

(30) Foreign Application Priority Data

Dec. 8, 2021 (CN) .......................... 202111490018.0

(51) Int. Cl.
*G06F 30/13* (2020.01)
(52) U.S. Cl.
CPC .................... *G06F 30/13* (2020.01)
(58) Field of Classification Search
CPC ....................................................... G06F 30/13
See application file for complete search history.

(56) References Cited

U.S. PATENT DOCUMENTS

2011/0082701 A1  4/2011  Sagar

FOREIGN PATENT DOCUMENTS

| CN | 104933675 B | 9/2015 | |
|---|---|---|---|
| CN | 107665275 B | 2/2018 | |
| CN | 109035365 B | 12/2018 | |
| CN | 114218634 B | 3/2022 | |
| WO | WO-2018227302 A1 * | 12/2018 | ............. B33Y 10/00 |

* cited by examiner

*Primary Examiner* — Bijan Mapar
(74) *Attorney, Agent, or Firm* — Birchwood IP

(57) ABSTRACT

The present disclosure discloses a systematic method for generating a planar expandable structure by adding hinged points and hinged rods based on uniform tessellation, including: establishing a database of planar uniform tessellation graphs; selecting, inputting a graph of arbitrarily size range, naming it Graph A; drawing a dual tessellation graph of the Graph A, and extracting a basic unit b from it; determining whether the basic unit b has rotational symmetry, if not, then expanding the basic unit b to adjacent units, and denoting a final combined unit as Graph C; choosing to add hinged points or hinged rods, adjusting a length of each side of the Graph C, making Graph C'; adding original tessellation polygons in the Graph A to corresponding angular points of the Graph C', rotating at a predetermined angle; hinging adjacent polygons by the hinged points or hinged rods together to obtain an expandable structural unit.

6 Claims, 16 Drawing Sheets

Closed state

Fully expanded state

METHOD FOR GENERATING PLANAR EXPANDABLE STRUCTURE BY ADDING HINGED POINTS AND HINGED RODS

CROSS-REFERENCE TO RELATED APPLICATIONS

This application is a continuation of co-pending International Patent Application No. PCT/CN2022/123865, filed on Oct. 8, 2022, which claims the priority and benefit of Chinese patent application number 202111490018.0, filed on Dec. 8, 2021 with China National Intellectual Property Administration, the entire contents of which are incorporated herein by reference.

TECHNICAL FIELD

The present application relates to the technical field of generating planar expandable structures, and in particular, to a method for generating a planar expandable structure by adding hinged points and hinged rods.

BACKGROUND

A movable structure is widely used in the fields of architecture and decoration design, mechanical design, stage design, product design and so on. At present, the common movable structures at home and abroad mostly adopt the way of three-dimensional folding or rotation, forming dynamic changes through the folding or rotation of each component in space. For example, in the movable building curtain wall or ceiling, the distributed drive mechanism is used to rotate a large number of small parts independently to obtain the overall opening and closing effect of the curtain wall.

In the process of implementing the present disclosure, the inventor found at least the following problems:

The three-dimensional movable manner usually occupies a large space, is complex in structure, requires many driving mechanisms, consumes much energy, is high in construction and operation costs and relatively low in stability, has limited design types, and is thus not universal and systematic.

SUMMARY

In view of above issues, embodiments of the present application aim to provide a method for generating a planar expandable structure by adding hinged points and hinged rods so as to overcome defects in the relevant technology.

According to an embodiment of the present application, provided is a systematic method for generating a planar expandable structure by adding hinged points and hinged rods based on uniform tessellation, where the method includes the following steps.

establishing a database of graphs which are in planar uniform tessellations, the database of graphs which are in planar uniform tessellation including a plurality of tessellation modes;

selecting one of the tessellation modes, inputting a graph of any desired size range, and naming the graph as Graph A;

drawing a dual tessellation graph of the Graph A, and extracting a basic unit b of the dual tessellation graph;

determining whether the basic unit b has rotational symmetry, if not, then expanding the basic unit b to adjacent units until a combined unit of the basic unit b and the adjacent units thereof has rotational symmetry, and obtaining a final combined unit which is denoted as Graph C;

choosing to add hinged points or hinged rods, and adjusting a length of each side of the Graph C to obtain Graph C';

adding original tessellation polygons in the Graph A to corresponding angular points of the Graph C' and performing rotation at a predetermined angle;

hinging adjacent polygons by the hinged points or hinged rods two by two to obtain an expandable structural unit; and spreading the expandable structural unit over a required range by means of offset, and outputting an overall structure.

Further, the selecting one of the tessellation modes, inputting a graph of any desired size range, and naming the graph as Graph A, includes:

selecting one of the tessellation modes;

inputting corresponding parameters according to an expansion range of design and the number of units required;

if a range required for the design is approximately circular, then defining the number of units within a radius coverage; and if the range required for the design is approximately rectangular, then defining the number of units in horizontal and vertical directions.

Further, the drawing a dual tessellation graph of the Graph A and extracting a basic unit b of the dual tessellation graph, includes:

connecting centroids of adjacent graphic units, with one centroid only being connected to centroids of two adjacent graphic units thereof, the formed graph namely being the dual tessellation graph of the Graph A, and taking a smallest repeating unit in the dual tessellation graph and denoting same as the basic unit b.

Further, the determining whether the basic unit b has rotational symmetry, if not, then expanding the basic unit b to adjacent units until a combined unit of the basic unit b and the adjacent units thereof has rotational symmetry, and obtaining a final combined unit which is denoted as Graph C, includes:

determining whether the basic unit b, when rotating at an angle θ (0<θ<360°), is able to overlap with an original graph, if overlap is possible, then proceeding to the next step; if no rotational symmetry is available, further expanding the adjacent basic units thereof until the combined unit of the basic unit b and the adjacent units thereof has rotational symmetry; extracting a graph formed by the final combined unit and denoting the graph as the Graph C.

Further, further included is: if the basic unit b has a plurality of adjacent units, selecting an adjacent unit with a smallest length of a connected side;

Further, the choosing to add hinged points or hinged rods, and adjusting a length of each side of the Graph C to obtain Graph C', includes:

extracting all corresponding original tessellation polygons on the Graph C, and denoting same in order as a block 1, a block 2 and a block 3 . . . with centroids thereof denoted as an angular point 1, an angular point 2 and an angular point 3 . . . ;

taking original tessellation polygons corresponding to two end points of one side, and respectively drawing connecting lines between centroids and vertices of the polygons closest to the side, with lengths denoted as L1 and L2, respectively;

calculating a length L' of the side after being adjusted, specifically: if choosing to add the hinged points, then L'=L1+L2; if choosing to add the hinged rods, then L'=L1+L2+a length of a side of the block; and adjusting a length of each side of an outer contour of C in order, and keeping a direction of each side unchanged, the adjusted graph being still a closed single ring which is denoted as C'.

Further, the adding original tessellation polygons in the Graph A to corresponding angular points of the Graph C' and performing rotation at a predetermined angle, includes:

adding the block 1 to the corresponding angular point 1 of the adjusted C' and making a centroid of the block 1 overlap with the angular point 1;

with the angular point 1 as a base point, rotating the block 1 and making one vertex thereof fall on a side of C'; and sequentially adding other external blocks to the corresponding angular points of C' according to the above two steps.

Further, the adding original tessellation polygons in the Graph A to corresponding angular points of the Graph C' and performing rotation at a predetermined angle, if choosing to add the hinged rods, further includes:

first determining whether the original Graph C has an internal point, if the original Graph C has the internal point, taking a centroid of the adjusted Graph C', namely a new internal point;

adding an internal block to the new internal point and making a centroid of the block overlap with the internal point;

connecting the centroid of the block to a centroid of any external block, and denoting a point of intersection of a connecting line and the external block as R;

with R as a center of a circle, and a length of a side of the block as a radius, drawing a circle I, then with a centroid of the internal block as a center of a circle, and a length from the centroid to a vertex of the block as a radius, drawing a circle II, and denoting one point of intersection of the circle I and the circle II as Q; and with the centroid of the internal block as a base point, rotating the block and making one vertex thereof overlap with Q.

Further, the hinging adjacent polygons by the hinged points or hinged rods two by two, includes:

if choosing to add the hinged points, hinging vertices of blocks which intersect two by two to obtain an expandable structural unit; and if choosing to add the hinged rods, first connecting vertices of the external blocks located on C' in sequence by using rod pieces, and then connecting the internal block to the external block to obtain an expandable structural unit, where lengths of the rod pieces are all equal to lengths of sides of the polygons, and the rod piece is hinged to the vertex of the block.

Further, a method for connecting the internal block to the external block is:

selecting one vertex of the internal block, by using the vertex as a center of a circle, and using a length of a side of the block as a radius, drawing a circle, if the circle passes through a vertex of an external block, adding the hinged rods between the two vertices, and if the circle does not pass through the vertex of the external block, not adding the hinged rods; and sequentially performing the above operations for all vertices of the internal blocks.

A technical solution provided by the embodiment of the present application may have the following beneficial effects.

This method adopts a design idea of rotating and expanding in a planar direction, and obtains, according to a geometric tessellation principle and duality principle, the innovative and systematic method for generating a movable structure. The tessellation principle reveals all uniform tessellation modes (points of intersection are all in the same form) consisting of regular polygons, and the duality principle reveals a relative position relationship of the graph before and after displacement. This method uses the uniform tessellation as a prototype to generate the planar expandable structure, and is beneficial to overcome the current outstanding technical problems in movable design. (1) Three-dimensional rotation or folding occupies large space, is complex in structure, consumes much energy, is high in construction cost and relatively low in stability, and the like. (2) Design is only limited to a few types, and thus is not universal and systemic.

According to the embodiment of the present application, based on the geometric uniform tessellation principle and duality principle, provided is the systematic method for generating a planar expandable structure by adding hinged points and hinged rods based on uniform tessellation. By applying this method, planar expandable structures in many forms can be quickly generated. Facet components of each structure are simply hinged and linked, such that the structure can rotate and expand as a whole under a small driving force. Compared with a three-dimensional movable structure, the planar expandable structure has the characteristics of low cost, a small occupation thickness, a simple structure and strong stability, such that the structure has outstanding application advantages in practice.

The uniform tessellation consisting of regular polygons is the most common geometric figure mode and is also most commonly used in all kinds of design work. The method in the embodiment of the present application is used for generating the expandable structure based on uniform tessellation, which has good universality and practical application value. This method is suitable for most planar uniform tessellation patterns. Results can be used in the fields of architecture and decoration design, mechanical design, furniture design, industrial product design, dynamic logo design, material microstructure design and so on.

It should be understood that the above general description and the later detailed description are only exemplary and explanatory and cannot limit the present application.

BRIEF DESCRIPTION OF THE DRAWINGS

Accompanying drawings herein are incorporated into a specification and constitute a part of this specification, show embodiments that conform to the present application, and are used for describing a principle of the present application together with this specification.

DETAILED DESCRIPTION OF THE EMBODIMENTS

Exemplary embodiments will be described in detail herein, examples of which are represented in the accompanying drawings. When the following description relates to the accompanying drawings, the same numerals in different accompanying drawings indicate the same or similar elements, unless otherwise indicated. The modes of implementation described in the following exemplary embodiments do not represent all modes of implementation that are consistent with the present application. On the contrary, they are only examples of devices and methods that are consistent with some aspects of the present application, as described in detail in the appended claims.

Terms used in the present application are used solely for the purpose of describing particular embodiments and are not intended to limit the present application. Singular forms of "a," "said," and "the" as used in the present application and the appended claims are also intended to include plural forms, unless the context clearly indicates other meanings. It should also be understood that the term "and/or" as used herein refers to and includes any or all possible combinations of one or more of the listed items in association with each other.

Figure 1:
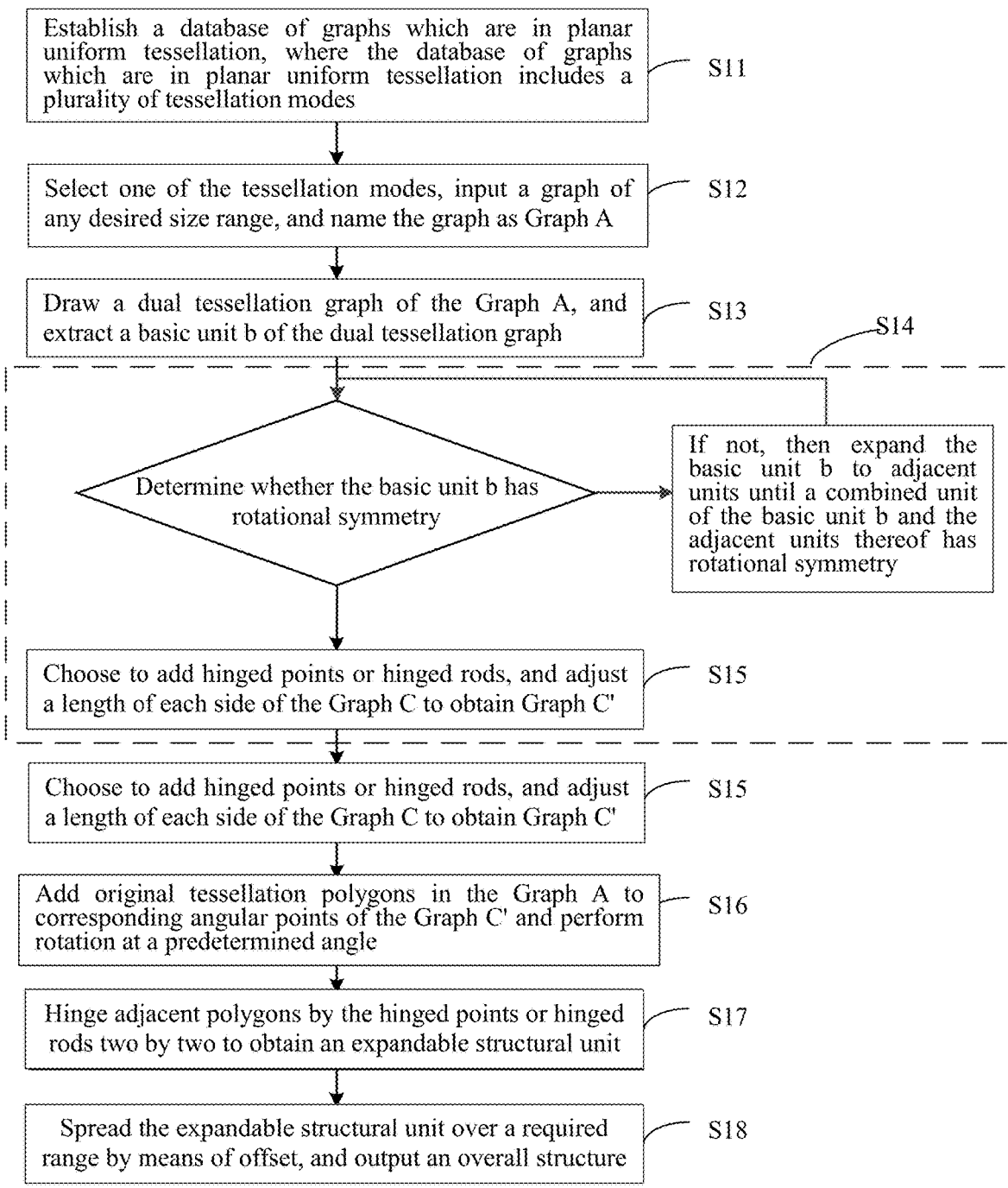
FIG. 1 is flowchart of a systematic method for generating an expandable structure by adding hinged points and hinged rods based on planar uniform tessellation provided by Embodiment 1 of the present disclosure.

FIG. 1 is flowchart of a systematic method for generating an expandable structure by adding hinged points and hinged rods based on planar uniform tessellation provided by Embodiment 1 of the present disclosure. An embodiment of the present disclosure provides a systematic method for generating an expandable structure by adding hinged points and hinged rods based on planar uniform tessellation. The uniform tessellation consisting of regular polygons is the most common combination mode of regular geometric figures and is also most commonly used in all kinds of design work. The method is based on a planar uniform tessellation pattern prototype, and establishes suitable tessellation graphic units and hinging manners thereof, so that the whole tessellation graph can rotate and expand on a plane. The method includes the following steps.

Step S11: establish a database of graphs which are in planar uniform tessellation, where the database of graphs which are in planar uniform tessellation includes a plurality of tessellation modes.

Specifically, input planar uniform tessellation graph modes and number same to obtain the database.

Step S12: select one of the tessellation modes, input a graph of any desired size range, and name the graph as Graph A.

Specifically, select one of the tessellation modes; input corresponding parameters according to an expansion range of design and the number of units required; if a range required for the design is approximately circular, then define the number of units within a radius coverage; and if the range required for the design is approximately rectangular, then define the number of units in horizontal and vertical directions.

Step S13: draw a dual tessellation graph of the Graph A, and extract a basic unit b of the dual tessellation graph.

Specifically, connect centroids of adjacent graphic units, with one centroid only being connected to centroids of two adjacent graphic units thereof, where the formed graph is namely the dual tessellation graph of the Graph A, and take a smallest repeating unit in the dual tessellation graph and denote same as the basic unit b.

Step S14: determine whether the basic unit b has rotational symmetry, namely after rotating around a certain internal point at a certain angle θ (0<θ<360°), whether overlap with itself is possible. If no rotational symmetry is available, then expand the basic unit b to adjacent units, if the basic unit b has a plurality of adjacent units, preferentially select an adjacent unit with a smallest length of a connected side until a combined unit of the basic unit b and the adjacent units thereof has rotational symmetry, and obtain a final combined unit which is denoted as Graph C; if a certain tessellation graph cannot obtain a combined unit with rotational symmetry, then it shows it is unable to use this method to perform expansion.

Step S15: choose to add hinged points or hinged rods, and adjust a length of each side of the Graph C to obtain Graph C'.

Specifically, extract all corresponding original tessellation polygons on the Graph C, and denote same in order as a block 1, a block 2 and a block 3 . . . with centroids thereof denoted as an angular point 1, an angular point 2 and an angular point 3 . . . ; take original tessellation polygons corresponding to two end points of one side, and respectively draw connecting lines between centroids and vertices of the polygons closest to the side, with lengths denoted as L1 and L2, respectively; calculate a length L' of the side after being adjusted, if choose to add the hinged points, then L'=L1+L2; if choose to add the hinged rods, then L'=L1+L2+a length of a side of the block; and adjust a length of each side of an outer contour of C in order, and keep a direction of each side unchanged, where the adjusted graph is still a closed single ring which is denoted as C'.

Step 16, add original tessellation polygons in the Graph A to corresponding angular points of the Graph C' and perform rotation at a predetermined angle.

Specifically, add the block 1 to the corresponding angular point 1 of the adjusted C' and making a centroid of the block 1 overlap with the angular point 1; with the angular point 1 as a base point, rotate the block 1 and make one vertex thereof fall on a side of C'; and sequentially add other external blocks to the corresponding angular points of C' according to the above two steps.

Add original tessellation polygons in the Graph A to corresponding angular points of the Graph C' and perform rotation at a predetermined angle, if choose to add the hinged rods, further includes:

first determine whether the original Graph C has an internal point, if the original Graph C has the internal point, take a centroid of the adjusted Graph C', namely a new internal point; add an internal block to the new internal point and make a centroid of the block overlap with the internal point; connect the centroid of the block to a centroid of any external block, and denote a point of intersection of a connecting line and the external block as R; with R as a center of a circle, and a length of a side of the block as a radius, draw a circle I, then with a centroid of the internal block as a center of a circle, and a length from the centroid to a vertex of the block as a radius, draw a circle II, and denote one point of intersection of the circle I and the circle II as Q; and with the centroid of the internal block as a base point, rotate the block and make one vertex thereof overlap with Q.

Step S17: hinge adjacent polygons by the hinged points or hinged rods two by two to obtain an expandable structural unit.

Specifically, if choose to add the hinged points, hinge vertices of blocks which intersect two by two so as to obtain an expandable structural unit; and if choose to add the hinged rods, first connect vertices of the external blocks located on C' in sequence by using rod pieces, and then connect the internal block to the external block to obtain an expandable structural unit, where lengths of the rod pieces are all equal to lengths of sides of the polygons, and the rod piece is hinged to the vertex of the block.

A method for connecting the internal block to the external block is: select one vertex of the internal block, by using the vertex as a center of a circle, and using a length of a side of the block as a radius, draw a circle, if the circle passes through a vertex of a certain external block, add the hinged rods between the two vertices, and if the circle does not pass through the vertex of the external block, not add the hinged rods; and sequentially perform the above operations for all vertices of the internal block.

Step S18: spread the expandable structural unit over a required range by means of offset, and output an overall structure.

Specifically, according to translational symmetry of the uniform tessellation, offset the obtained expandable structural unit, and spread same over the required range to obtain a final planar expandable structure and output same.

The above steps are further refined below in conjunction with embodiments.

Embodiment 1

On the basis of the method provided by the present disclosure, the present embodiment selects a manner for adding hinged points to generate a series of expandable structures, which specifically includes the following steps:

Step 1, establish a database of graphs which are in planar uniform tessellation, where the database of graphs which are in planar uniform tessellation includes a plurality of tessellation modes.

The planar tessellation refers to spreading geometric figures over a whole plane, without any gaps or overlaps between the figures. All the planar tessellation studied by the present disclosure is side-to-side and point-to-point polygonal tessellation modes. If the tessellation only consists of regular polygons, then it is called the uniform tessellation.

Figure 2:
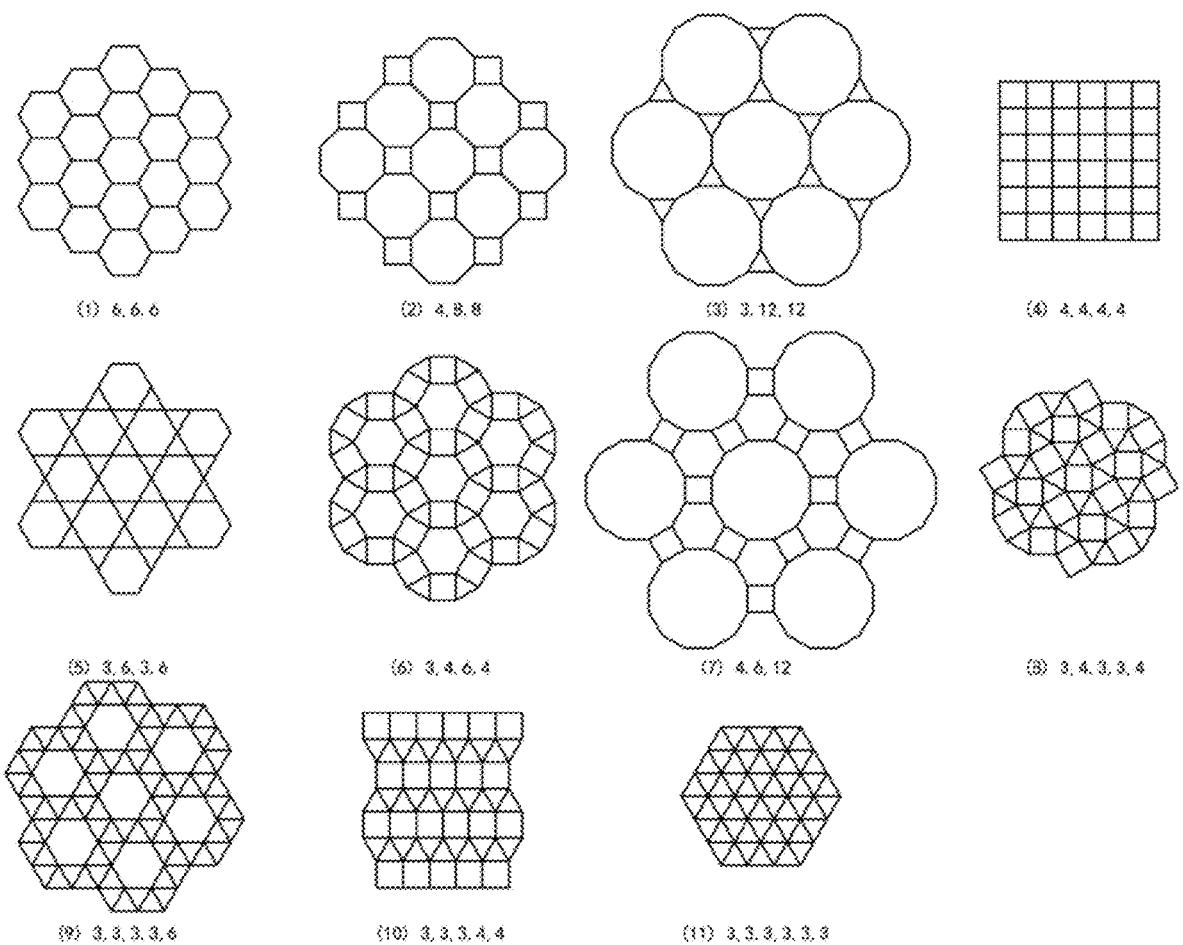
FIG. 2 is a schematic diagram of 11 kinds of single-point of intersection one-order planar uniform tessellation graphs.

The present embodiment takes single-point of intersection uniform tessellation (all points of intersection are in the same type) as an example, 11 kinds of planar tessellation modes (FIG. 2) are input, and a planar uniform tessellation database with code numbers of 1-11 is established, where numbers indicate the number of sides of regular polygons clustered at one point of intersection (Table 1) For convenient calculation, lengths of sides of the tessellation polygons are all defined as 1.

TABLE 1

| A database of single-point of intersection one-order planar uniform tessellation | |
|---|---|
| Code number | Tessellation polygon (numbers indicate the number of sides of regular polygons around a point of intersection) |
| 1 | 6, 6, 6 |
| 2 | 4, 8, 8 |
| 3 | 3, 12, 12 |
| 4 | 4, 4, 4, 4 |
| 5 | 3, 6, 3, 6 |
| 6 | 3, 4, 6, 4 |
| 7 | 4, 6, 12 |
| 8 | 3, 3, 3, 3, 3, 3 |
| 9 | 3, 4, 3, 3, 4 |
| 10 | 3, 3, 3, 3, 6 |
| 11 | 3, 3, 3, 4, 4 |

Step 2: select one of the tessellation modes, input a graph of any desired size range, and name the graph as Graph A.

In the present embodiment, the sixth tessellation mode (3, 4, 6, 4) in Table 1 is selected and a manner for adding hinged points is used as a demonstration.

Input corresponding parameters according to an expansion range of design and the number of units required. If a range required for the design is approximately circular, then define the number of units within a radius coverage, and if the range required for the design is approximately rectangular, then define the number of units in horizontal and vertical directions. In the present embodiment, an approximately rhombic range in the (3, 4, 6, 4) tessellation mode is input, and the obtained Graph A is as shown in (1) in FIG. 3.

Step 3: draw a dual tessellation graph of the Graph A, and extract a basic unit b of the dual tessellation graph.

Figure 3:
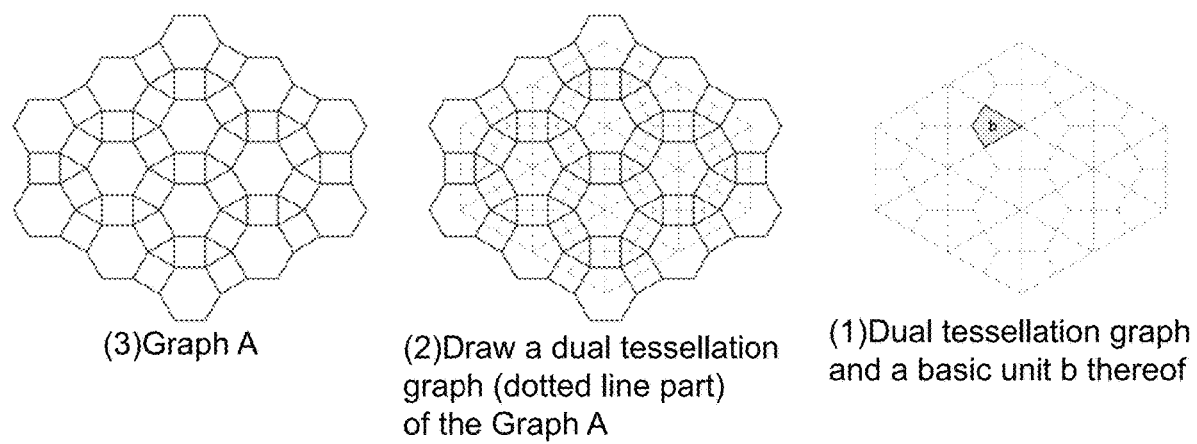
FIG. 3 is a schematic diagram of a selected Graph A in a certain range, a dual tessellation graph of the Graph A and a basic unit b of the dual tessellation graph provided by Embodiment 1 of the present disclosure.

In the Graph A, take centroids of each regular triangle, square and regular hexagon and connect centroids of adjacent graphic units, with one centroid only being connected to centroids of two adjacent graphic units thereof, where the formed graph is the dual tessellation graph of the Graph A (dotted line part in (2) in FIG. 3); take a smallest repeating unit of the dual tessellation graph, which is a quadrangle ((3) in FIG. 3), and denote same as the basic unit b.

Step 4: determine whether the basic unit b has rotational symmetry, if not, then expand the basic unit b to adjacent units until a combined unit of the basic unit and the expanded unit has rotational symmetry, and obtain a final combined unit which is denoted as Graph C.

Determine whether the basic unit b, when rotating at a certain angle θ (0<θ<360°), is able to overlap with an original graph. The basic unit b in the present embodiment does not have rotational symmetry, and it is needed to further expand adjacent basic units.

Figure 4:
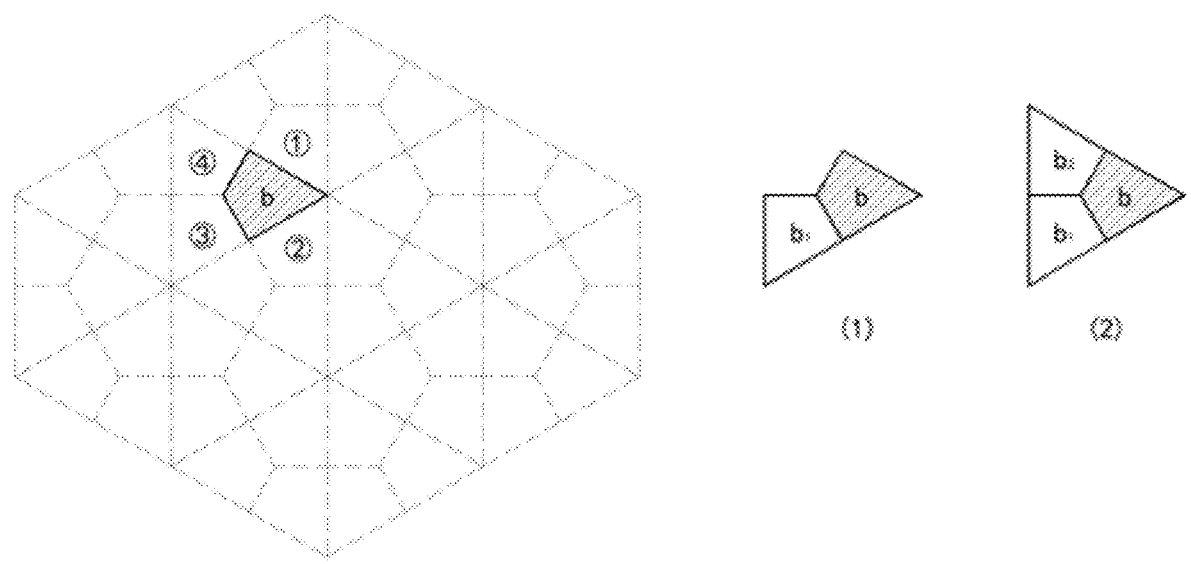
FIG. 4 is a schematic diagram in which adjacent units are expanded to make a combined unit have rotational symmetry provided by Embodiment 1 of the present disclosure.

As shown in FIG. 4, in the present embodiment, four units are adjacent to b, where a length of sides connected to ① and ② is largest, a length of sides connected to ③ and ④ is smallest, units with a smallest length of connected sides should be selected, and therefore both ③ and ④ can be selected; ③ is selected as a basic unit b1 in the present embodiment (as (1) in FIG. 4). Further determine whether the combined unit of b and b1 has rotational symmetry. In this case, rotational symmetry is still not available, and an adjacent unit b2 is further expanded. A combined unit of b, b1, and b2 has rotational symmetry as shown in (2) in FIG. 4. Therefore, an outer contour of the combined unit is extracted and denoted as graph C.

Figure 5:
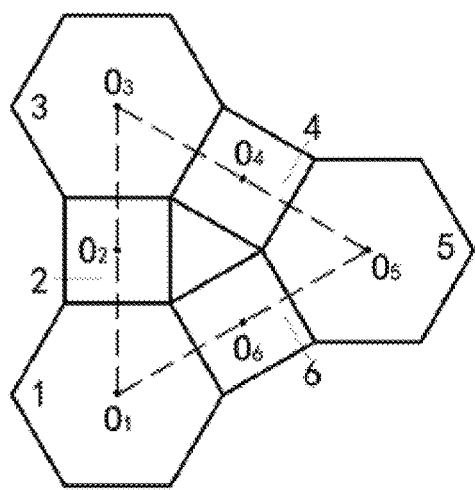
FIG. 5 is a schematic diagram of the obtained Graph C and corresponding original tessellation polygons thereof provided by Embodiment 1 of the present disclosure.
Figure 6:
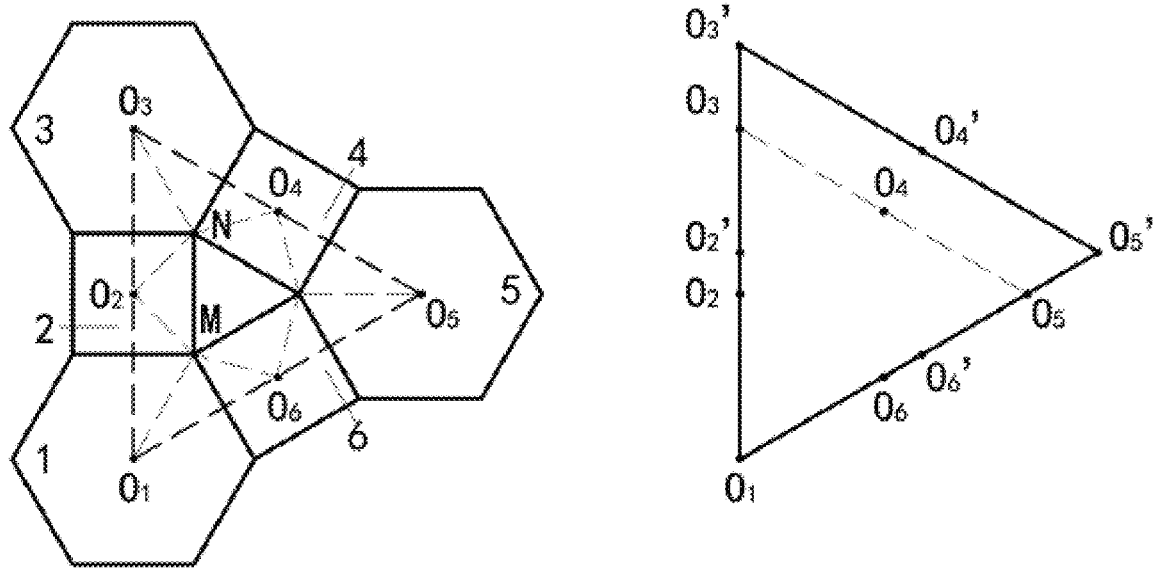
FIG. 6 is a schematic diagram of a method for adjusting a length of each side of Graph C provided by Embodiment 1 of the present disclosure.

Step 5: choose to add hinged points or hinged rods, and adjust a length of each side of the Graph C to obtain Graph C';

extract all corresponding original tessellation polygons on the Graph C, and number same in order as a block 1, a block 2 . . . with points corresponding to centroids of polygons on the Graph C denoted as O1, O2 . . . in sequence (FIG. 5); and starting from a point O1, first adjust a length of O1O2. Take the block 1 and the block 2 corresponding to O1 and O2, and respectively draw connecting lines of centroids of the blocks and a closest vertex M of the two blocks, as shown in FIG. 6, being MO1 and MO2, and take a point O2' on an extension line of O1O2, so that O1O2'=MO1+MO2; then draw a parallel line of O2O3 by passing through O2', and take a point O3' on the parallel line, and make a length of a side O2'O3' equal to a sum of lengths from centroids of the block 2 and the block 3 to a vertex N, as shown in FIG. 6, the length is NO2+NO3.

Lengths of remaining sides of C are adjusted according to the above method, a triangle O1O3'O5' is finally obtained and is graph C' (FIG. 6, right), and the adjusted graph is still a closed single ring.

Step 6: Add original tessellation polygons in the Graph A to corresponding angular points of the Graph C' and perform rotation at a predetermined angle.

Starting from the block 1, sequentially add each regular polygon in the Graph A to the corresponding angular points of C'. Translate the block 1 to the point O1 and make a centroid thereof overlap with O1; then with the point O1 as a base point, rotate the block 1 and make the vertex thereof fall on a side of B. Sequentially add and rotate the remaining blocks in this way. Since a center point of the combined unit is discarded in step 4, a regular triangle corresponding to the point is not added any more.

Figure 7:
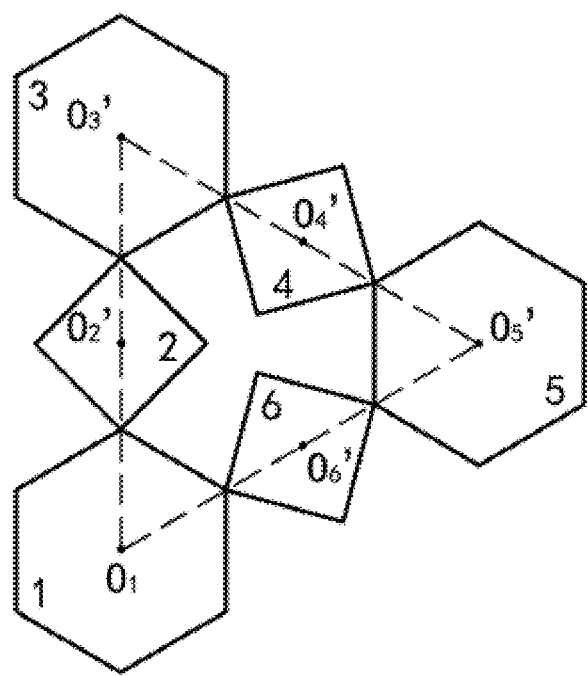
FIG. 7 is a schematic diagram of a basic unit of a generated planar expandable structure provided by Embodiment 1 of the present disclosure.

Step 7: Choose a manner of adding the hinged points in the present embodiment, and hinge vertices of blocks which intersect two by two to obtain an expandable structural unit (FIG. 7).

Step 8: spread the expandable structural unit over a required range by means of offset, and output an overall structure.

Figure 8:
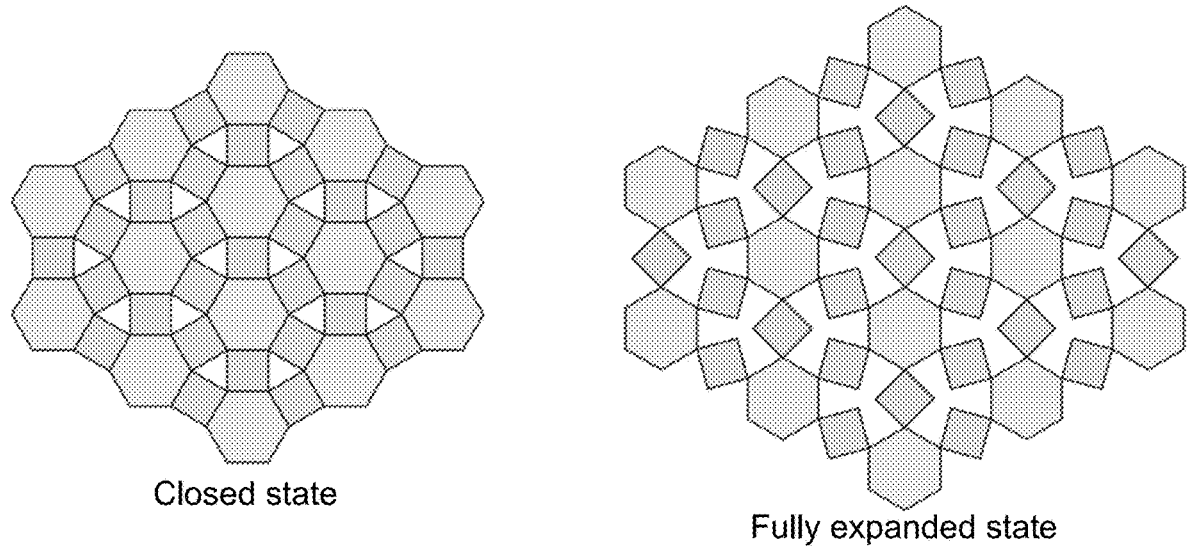
FIG. 8 is a schematic diagram of a closed state and a fully expanded state of a generated planar expandable structure provided by Embodiment 1 of the present disclosure.

Due to translational symmetry of the uniform tessellation, offset the obtained hinged tessellation expanded unit, and spread same over the required range to obtain a final planar expandable structure. Output the overall structure, and count information such as the type, size, number, and hinged point number of the block. FIG. 8 shows states of a planar expandable structure formed after using the method described in the present disclosure, with a closed state on the left and a fully expanded state on the right. Since a regular triangular face is discarded in step 6 above, a regular triangular gap is left in the closed state.

The present embodiment shows an example of obtaining the planar expandable structure by adding hinged points on the basis of (3, 4, 6, 4) type uniform tessellation. The expandable structure consists of 2 types of facets, namely a square and a regular hexagon, which are hinged two by two, the closed state thereof is the same as that of the original tessellation graph, and the expanded state thereof is different from that of the original tessellation graph. The present embodiment has simple patterns, few component types and a simple structure, and can rotate and expand along a planar direction under the action of a single driving force to achieve a movable effect.

Embodiment 2

Figure 9:
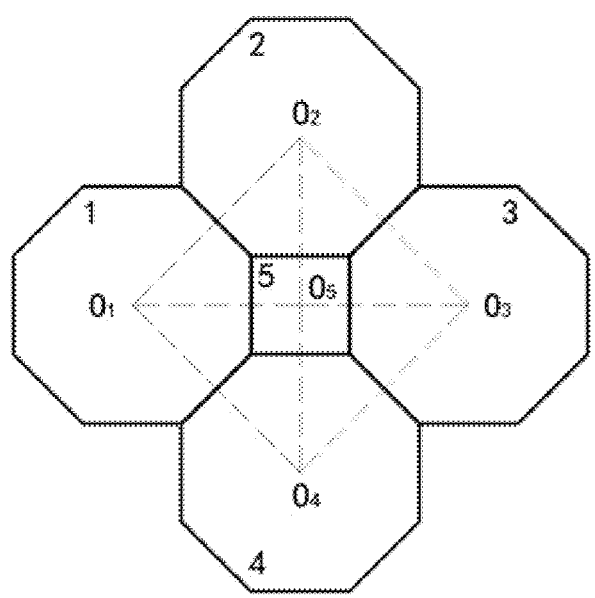
FIG. 9 is a schematic diagram of the obtained Graph C and corresponding original tessellation polygons thereof provided by Embodiment 2 of the present disclosure.

On the basis of the method provided by the present disclosure, the present embodiment selects a manner for adding hinged rods to generate a series of expandable structures. In terms of the method, step 1 to step 4 are the same as those in Embodiment 1. In step 2, the second tessellation mode (4, 8, 8) is selected, and the obtained Graph C and corresponding original tessellation polygons thereof are as shown in FIG. 9.

Figure 10:
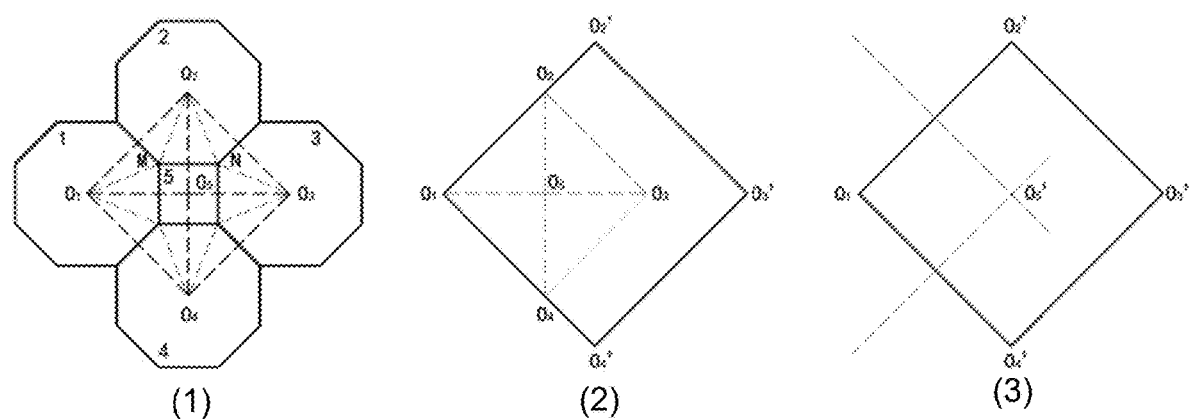
FIG. 10 is a schematic diagram of a method for adjusting a length of each side of Graph C provided by Embodiment 2 of the present disclosure.

In step 5, first adjust an outer contour of Graph C, first adjust a length of $O_1O_2$, take a block 1 and a block 2 corresponding to $O_1$ and $O_2$, respectively draw connecting lines of centroids of the blocks and a closest vertex (point M in (1) in FIG. 10) of the two blocks, being $MO_1$ and $MO_2$, take a point $O_2'$ on an extension line of $O_1O_2$, so that $O_1O_2'=MO_1+MO_2+$a length of a side of the block; then draw a parallel line of $O_2O_3$ by passing through $O_2'$, take a point $O_3'$ on the parallel line and make a length of a side $O_2'O_3'$ equal to lengths from centroids of the block 2 and a block 3 to a vertex N and a length of a side of one block, as shown in FIG. 10, the length is equal to $NO_2+NO_3+$a length of a side of the block. Adjust lengths of remaining sides of the outer contour according to the above method, and finally obtain a closed quadrangle $O_1O_2'O_3'O_4'$ ((2) in FIG. 10).

Further determine the position of the adjusted internal point $O_5'$, as a centroid of the adjusted quadrangle $O_1O_2'O_3'O_4'$, i.e., the internal point $O_5'$ ((3) in FIG. 10).

Figure 11:
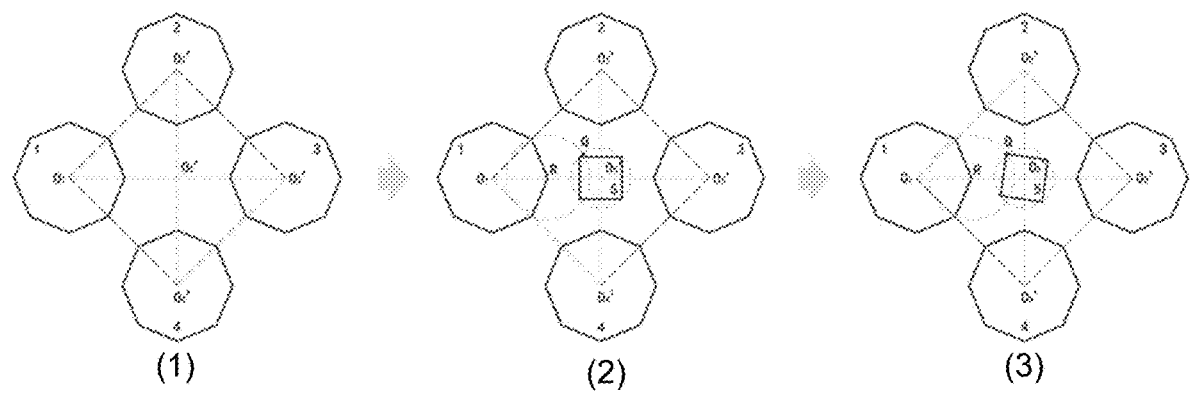
FIG. 11 is a schematic diagram showing adding blocks to corresponding angular points of Graph C' provided by Embodiment 2 of the present disclosure.

Step 6, first add an external block, where a specific method is the same as step 6 of Embodiment 1, which will not be repeated herein, as shown in (1) of FIG. 11 after operation is completed. Then add an internal block 5 to a corresponding point, where a specific method is: translate the block 5 to the internal point $O_5'$, and make the centroid thereof overlap with $O_5'$; with a point of intersection of the block 1 and a side $O_1O_3'$ as a center of a circle R, and the length of the side of the block as a radius, draw a circle I; with $O_5'$ as a center of a circle, and a length from the centroid of the block 5 to a vertex as a radius, draw a circle II; denote one point of intersection of the circle I and the circle II as Q ((2) in FIG. 11). With the point $O_5'$ as a base point, rotate the block 5 and make one vertex of the block 5 overlap with the point Q ((3) in FIG. 11).

Figure 12:
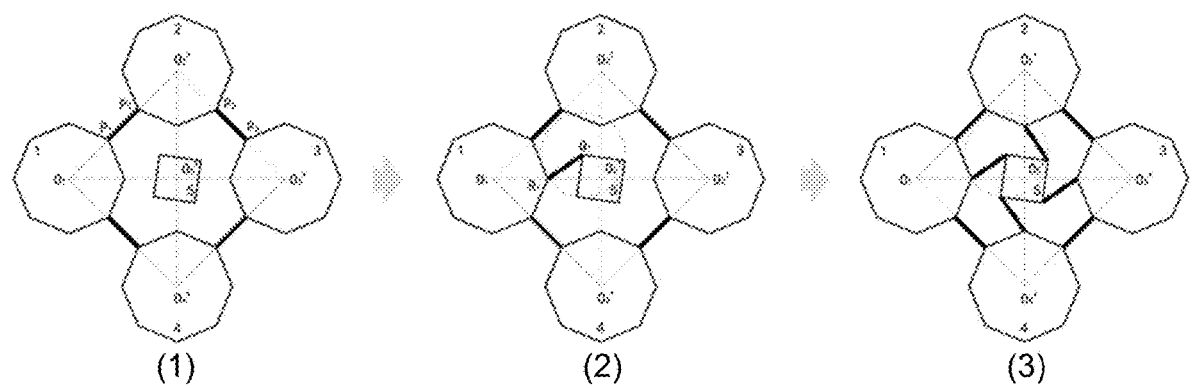
FIG. 12 is a schematic diagram of a method for adding hinged rods between adjacent blocks provided by Embodiment 2 of the present disclosure.

Step 7: sequentially add hinged rods between adjacent polygons. First add rod pieces between external blocks. Take a vertex of the external block on Graph C' and sequentially add rod pieces between such kind of vertices of adjacent blocks (FIG. 12).

Then add rod pieces at the internal block and the external block and select a vertex Q1 of the block 5 and draw a circle with the vertex as a center of a circle and the length of a side of the block as a radius, if the circle passes through a vertex of a certain external block, as shown in FIG. 8, the circle passes through a vertex R1 of the block 1, then add the rod pieces between vertex Q1 of the block 5 and R1. If the circle does not pass through a vertex of an external cell, no rod pieces are added. Sequentially perform the above operations for all vertices of the block 5. Lengths of the added rod pieces are all the lengths of sides of the block. The finally obtained hinged tessellation graph is as shown in (3) in FIG. 12, being a planar expandable structural unit.

Figure 13:
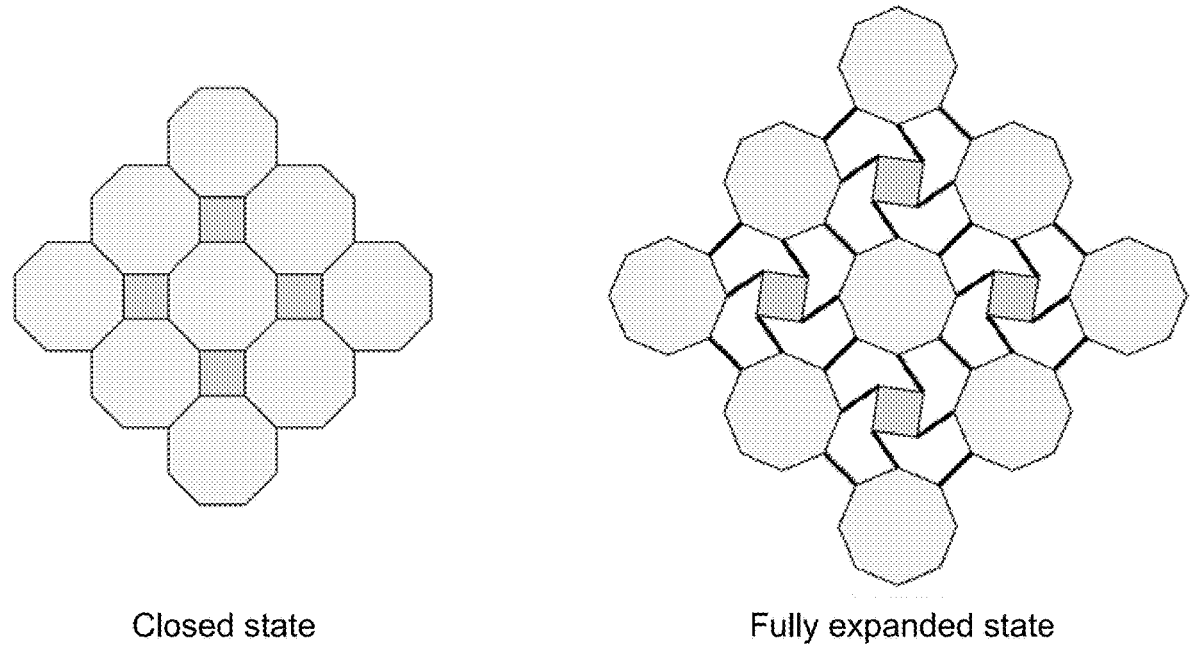
FIG. 13 is a schematic diagram of a closed state and a fully expanded state of a generated expandable structure provided by Embodiment 2 of the present disclosure.

Step 8, spread the planar expandable structural unit over a required range by means of offset to obtain final planar expandable structural states, as shown in FIG. 13, with a closed state on the left and a fully expanded state on the right.

The present embodiment shows a planar expandable structure generated by adding hinged rods on the basis of (4, 8, 8) type uniform tessellation. The structure consists of 2 types of facets, namely a square and a regular octagon, which are hinged two by two, the closed state thereof is the same as that of the original tessellation graph, and the expanded state thereof is different from that of the original tessellation graph. The expandable structure obtained by adding the hinged rods has a greater degree of expansion than that obtained by adding the hinged points. The embodiment has attractive patterns, few component types and a simple structure, and can rotate and expand along a planar direction under the action of a single driving force.

Embodiment 3

Figure 14:
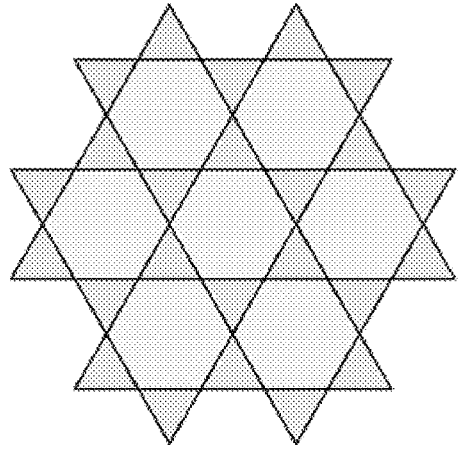
FIG. 14 is a schematic diagram of a closed state and a fully expanded state of a planar expandable structural unit generated in a (3, 6, 3, 6) tessellation mode provided by Embodiment 3 of the present disclosure.
Figure 14:
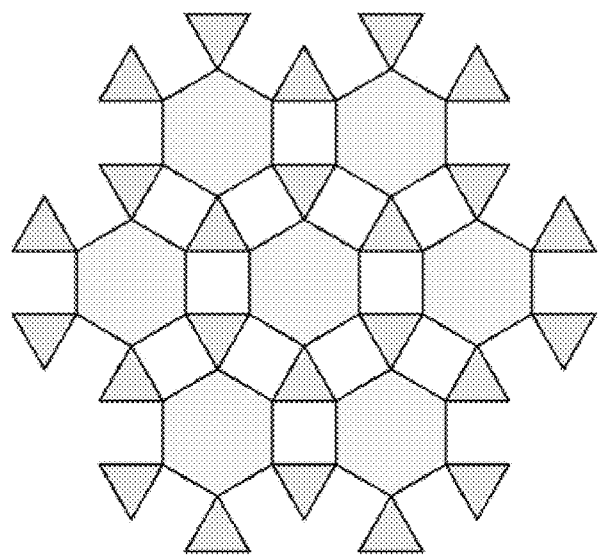

The present embodiment relates to a scheme for generating movable (adjustable) building skin by adding hinged points on the basis of the method provided by the present disclosure. In terms of the method, step 1 to step 7 are the same as those in Embodiment 1. A fifth tessellation mode (3, 6, 3, 6) is selected in step 2, and a closed state and an expanded state of a generated planar expandable structure are as shown in FIG. 14. In specific operations, some units can be designed into a hollow-out state, which enhances functionality and artistry, as in this example, the central regular hexagon is hollowed out.

Figure 15:
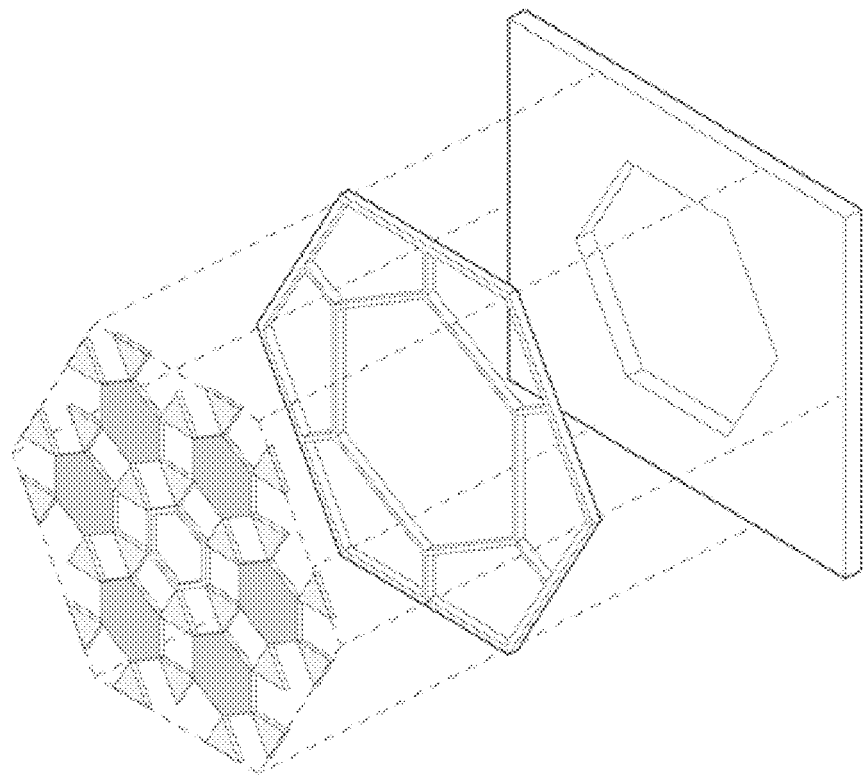
FIG. 15 is a hierarchy diagram of a generated movable building skin unit provided by Embodiment 3 of the present disclosure.
Figure 16:
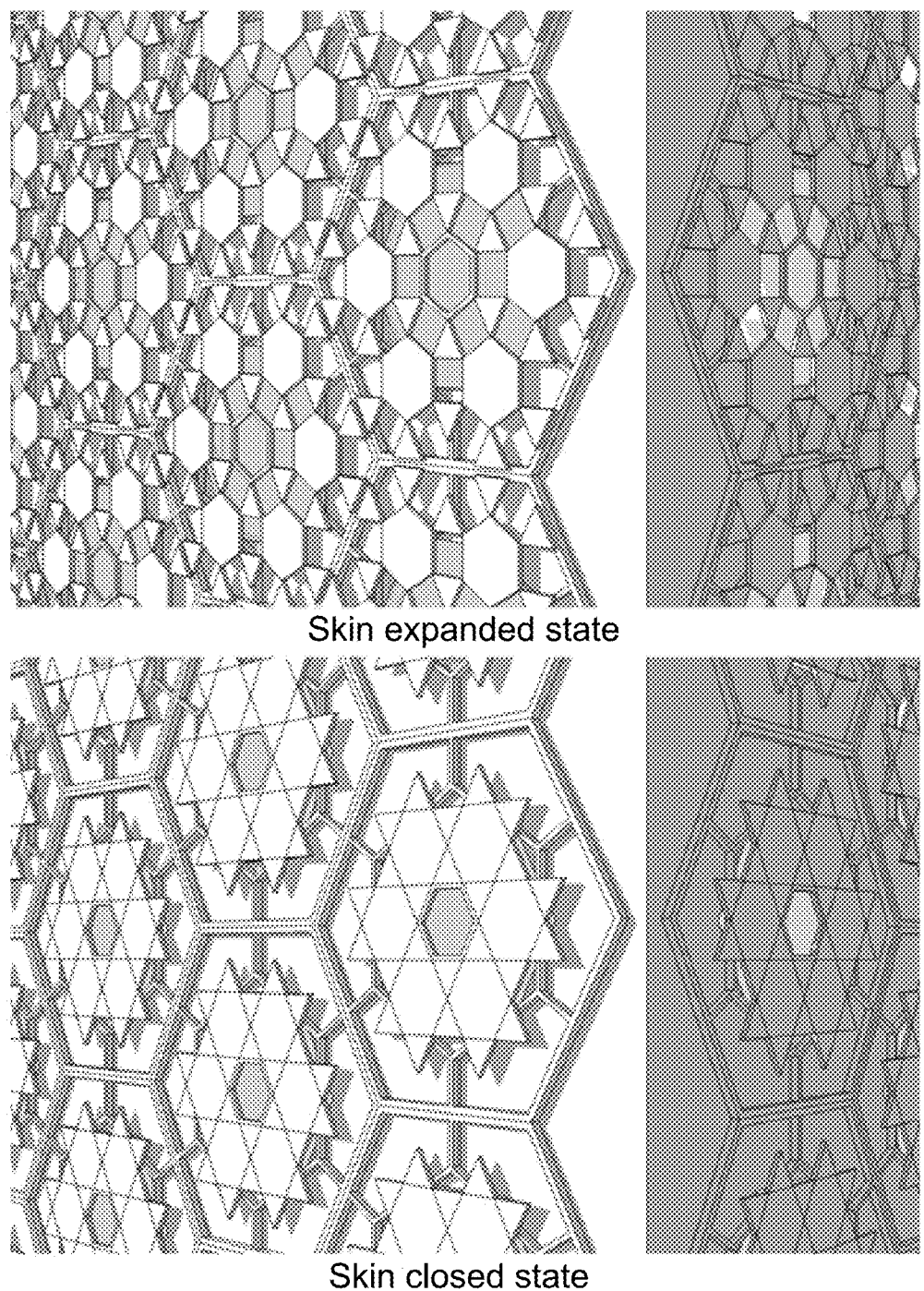
FIG. 16 is an effect picture of an expanded state and a closed state of generated movable building skin provided by Embodiment 3 of the present disclosure.

Step 8, output the overall structure. The specific practice: add an expandable structural unit at a corresponding position of a window of a building elevation, and according to the size of the window of the elevation, adjust the scale of the structural unit. Generate an orthohexagonal outer contour of the structural unit as keels of the building skin, and add supports at appropriate positions inside to form a structural layer of the skin. FIG. 15 is a hierarchy diagram of a planar expandable structural unit. Offset the structural unit to obtain final building skin concept design (FIG. 16).

Finally, output information about facets and kneel of the building skin. In this movable skin, there are 2 types of facets which are a regular triangle and a regular hexagon. The structural layer of the skin has kneels in three sizes, and a surface layer has one type of kneel. There are hinged points in one kind of connection and two kinds of facets. Output the number of various components at the same time, which will be prefabricated in the factory for assembly construction during actual construction.

In addition to the above advantages of Embodiment 1, the movable building skin can also adjust the skin to be opened or closed in combination with existing sensing and driving technologies according to the intensity of optical radiation to achieve an energy-saving effect of a building. When the optical radiation is weak, the skin is in an expanded state to meet the demand of natural daylighting. When the optical radiation is strong, the skin is in a closed state to shield direct irradiation of sunlight, thereby alleviating indoor glare and heat radiation. Compared with the common way of folding or rotating the skin unit at present, the planar expandable skin generated by the present patent is simple in construction manner and driving manner, high in robustness, low in cost, and has practical application value.

The embodiment of the present disclosure provides a systematic method for generating a planar expandable structure, which provides a systematic solution for innovative design of a movable structure. This method can be applied to most planar uniform tessellation graphs revealed in the current geometry to carry out determination and expansion. The present disclosure is not limited to the above embodiments, and any technical solutions not departing from the present disclosure, i.e., merely carrying out improvements or changes known to a person of ordinary skill in the art thereon, are all within the scope of protection of the present disclosure.

Those skilled in the art can easily conceive of other implementation solutions of the present application upon consideration of the specification and practice of what is disclosed herein. The present application is intended to cover any variations, uses, or adaptive changes thereof that follow the general principles of the present application and include common general knowledge or customary technical means in the technical field not disclosed herein. The specification and embodiments are to be regarded as exemplary only, and the true scope and spirit of the present application are indicated by the claims.

It is to be understood that the present application is not limited to the precise structure described above and illustrated in the accompanying drawings, and that various modifications and changes may be made without departing from the scope thereof. The scope of the present application is limited only by the appended claims.

What is claimed is:

1. A systematic method for generating a planar expandable structure by adding hinged points and hinged rods based on uniform tessellation, applied in generating movable building skin, wherein the method comprises the following steps:

establishing a database of graphs which are in planar uniform tessellation, the database of graphs which are in planar uniform tessellation comprising a plurality of tessellation modes;

selecting one of the tessellation modes, inputting a graph of any desired size range, and naming the graph as Graph A;

drawing a dual tessellation graph of the Graph A, and extracting a basic unit b of the dual tessellation graph;

specifically: connecting centroids of adjacent graphic units, with one centroid only being connected to centroids of two adjacent graphic units thereof, the formed graph namely being the dual tessellation graph of the Graph A, and taking a smallest repeating unit in the dual tessellation graph and denoting same as the basic unit b;

determining whether the basic unit b has rotational symmetry, if not, then expanding the basic unit b to adjacent units until a combined unit of the basic unit b and the adjacent units thereof has rotational symmetry, and obtaining a final combined unit which is denoted as Graph C;

choosing to add hinged points or hinged rods, and adjusting a length of each side of the Graph C to obtain Graph C';

adding original tessellation polygons in the Graph A to corresponding angular points of the Graph C' and performing rotation at a predetermined angle;

hinging adjacent polygons by the hinged points or hinged rods two by two to obtain an expandable structural unit; and spreading the expandable structural unit over a required range by means of offset, and outputting an overall structure;

wherein the outputting an overall structure comprises;

adding an expandable structural unit at a corresponding position of a window of a building elevation, adjusting a scale of the expandable structural unit according to a size of the window of the building elevation, generating an orthohexagonal outer contour of the structural unit as keels of the building skin, and adding supports at corresponding positions to form a structural layer of the building skin;

wherein the determining whether the basic unit b has rotational symmetry, if not, then expanding the basic unit b to adjacent units until a combined unit of the basic unit b and the adjacent units thereof has rotational symmetry, and obtaining a final combined unit which is denoted as Graph C, comprises:

determining whether the basic unit b, when rotating at an angle $\theta$, is able to overlap with an original graph, $0<\theta<360°$, if overlap is possible, then proceeding to the next step; if no rotational symmetry is available, further expanding the adjacent basic units thereof until the combined unit of the basic unit b and the adjacent units thereof has rotational symmetry; extracting a graph formed by the final combined unit and denoting the graph as the Graph C;

if the basic unit b has a plurality of adjacent units, selecting an adjacent unit with a smallest length of a connected side;

wherein the choosing to add hinged points or hinged rods, and adjusting a length of each side of the Graph C to obtain Graph C', comprises:

extracting all corresponding original tessellation polygons on the Graph C, and denoting same in order as a block 1, a block 2 and a block 3 . . . with centroids thereof denoted as an angular point 1, an angular point 2 and an angular point 3 . . . ;

taking two original tessellation polygons corresponding to two angular points of one side of the Graph C, and respectively drawing connecting lines between centroids of the original tessellation polygons and vertices of the original tessellation polygons closest to the side, with lengths denoted as L1 and L2, respectively;

calculating a length L' of the side after being adjusted, specifically: if choosing to add the hinged points, then L'=L1+L2; if choosing to add the hinged rods, then L'=L1+L2+a length of a side of the block; and adjusting a length of each side of an outer contour of C in order, and keeping a direction of each side unchanged, the adjusted graph being still a closed single ring which is denoted as C'.

2. The method according to claim 1, wherein the selecting one of the tessellation modes, inputting a graph of any desired size range, and naming the graph as Graph A, comprises:

select one of the tessellation modes;

inputting corresponding parameters according to an expansion range of design and the number of units required;

if a range required for the design is approximately circular, then define the number of units within a radius coverage; and if the range required for the design is approximately rectangular, then defining the number of units in horizontal and vertical directions.

3. The method according to claim 1, wherein the adding original tessellation polygons in the Graph A to corresponding angular points of the Graph C' and performing rotation at a predetermined angle, comprises:

adding the block 1 to the corresponding angular point 1 of the adjusted C' and making a centroid of the block 1 overlap with the angular point 1;

with the angular point 1 as a base point, rotating the block 1 and making one vertex thereof fall on a side of C'; and sequentially adding other external blocks to corresponding angular points of C' according to the above two steps.

4. The method according to claim 1, wherein the adding original tessellation polygons in the Graph A to corresponding angular points of the Graph C' and performing rotation at a predetermined angle, if choosing to add the hinged rods, further comprises:

first determining whether the original Graph C has an internal point, if the original Graph C has the internal point, taking a centroid of the adjusted Graph C', namely a new internal point;

adding an internal block to the new internal point and making a centroid of the block overlap with the new internal point;

connecting the centroid of the block to a centroid of any external block, and denoting a point of intersection of a connecting line and the external block as R;

with R as a center of a circle, and a length of a side of the external block as a radius, drawing a circle I, then with a centroid of the internal block as a center of a circle, and a length from the centroid to a vertex of the internal block as a radius, drawing a circle II, and denoting one point of intersection of the circle I and the circle II as Q; and with the centroid of the internal block as a base point, rotating the block and making one vertex thereof overlap with Q.

5. The method according to claim 1, wherein the hinging adjacent polygons by the hinged points or hinged rods two by two, comprises:

if choosing to add the hinged points, hinging vertices of blocks which intersect two by two to obtain an expandable structural unit; and if choosing to add the hinged rods, first connecting vertices of the external blocks located on C' in sequence by using rod pieces, and then connecting the internal block to the external block to obtain an expandable structural unit, wherein lengths of the rod pieces are all equal to lengths of sides of the polygons, and the rod piece is hinged to the vertex of the block.

6. The method according to claim 5, wherein a method for connecting the internal block to the external block comprises:

selecting one vertex of the internal block, by using the vertex as a center of a circle, and using a length of a side of the internal block as a radius, drawing a circle, if the circle passes through a vertex of an external block, adding the hinged rods between the two vertices, and if the circle does not pass through the vertex of the external block, not adding the hinged rods; and sequentially performing the above operations for all vertices of the internal blocks, sequentially adding other external blocks to the corresponding angular points of C' according to the above two steps.

* * * * *